United States Patent
Yamamoto et al.

(10) Patent No.: US 6,963,513 B2
(45) Date of Patent: Nov. 8, 2005

(54) FABRICATION METHOD OF SEMICONDUCTOR DEVICE

(75) Inventors: Toshitaka Yamamoto, Hitachi (JP); Shouji Satou, Ibaraki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/919,350

(22) Filed: Aug. 17, 2004

(65) Prior Publication Data

US 2005/0019972 A1 Jan. 27, 2005

Related U.S. Application Data

(62) Division of application No. 10/457,549, filed on Jun. 10, 2003, now Pat. No. 6,815,322.

(30) Foreign Application Priority Data

Jul. 10, 2002 (JP) ..................................... 2002-200834

(51) Int. Cl.⁷ ............................................. G11C 11/00
(52) U.S. Cl. ........................ 365/201; 365/51; 365/365; 365/94
(58) Field of Search ............................ 365/201, 51, 94

(56) References Cited

U.S. PATENT DOCUMENTS

| | | | | |
|---|---|---|---|---|
| 5,581,510 A | * | 12/1996 | Furusho et al. | 365/201 |
| 5,726,920 A | * | 3/1998 | Chen et al. | 702/108 |
| 6,180,425 B1 | * | 1/2001 | Mielke et al. | 438/15 |
| 6,181,615 B1 | * | 1/2001 | Chhor | 365/201 |
| 6,198,657 B1 | | 3/2001 | Uekubo et al. | 365/185.04 |
| 6,367,042 B1 | * | 4/2002 | Phan et al. | 714/733 |
| 6,412,072 B2 | | 6/2002 | Little et al. | 713/200 |
| 6,436,741 B2 | * | 8/2002 | Sato et al. | 438/149 |
| 6,473,345 B2 | * | 10/2002 | Hayasaka et al. | 365/191 |
| 6,551,844 B1 | * | 4/2003 | Eldridge et al. | 438/14 |
| 6,580,092 B2 | * | 6/2003 | Tomishima | 257/48 |
| 6,597,602 B2 | | 7/2003 | Imamiya et al. | 365/185.04 |
| 6,661,712 B2 | | 12/2003 | Hiraki et al. | 365/189.05 |
| 6,815,322 B2 | * | 11/2004 | Yamamoto et al. | 438/598 |
| 6,825,052 B2 | * | 11/2004 | Eldridge et al. | 438/15 |
| 6,829,737 B1 | * | 12/2004 | McBride | 714/718 |
| 6,885,599 B2 | * | 4/2005 | Saitoh et al. | 365/201 |
| 2002/0097611 A1 | * | 7/2002 | Hayasaka et al. | 365/191 |
| 2003/0122550 A1 | * | 7/2003 | Kanamaru et al. | 324/537 |
| 2004/0181724 A1 | * | 9/2004 | McBride | 714/735 |

FOREIGN PATENT DOCUMENTS

| | | |
|---|---|---|
| JP | 59-222952 | 12/1984 |
| JP | 4-78173 | 3/1992 |
| JP | 05-304277 | 11/1993 |
| JP | 07-283287 | 10/1995 |

* cited by examiner

Primary Examiner—Viet Q. Nguyen
(74) Attorney, Agent, or Firm—Miles & Stockbridge P.C.

(57) ABSTRACT

The present invention provides a technology capable of shortening a TAT of a microcomputer with a nonvolatile memory built therein and achieving a reduction in cost. Flash ROMs comprising memory cells each substantially identical in structure to each of memory cells of a flash memory are formed in their corresponding chips lying in a wafer. Subsequently, memory information is written into each of the memory cells of the flash ROM in a probe test process. Thereafter, the memory information written into the memory cell thereof is made unreprogrammable to thereby disable rewriting of the post-shipment memory information. Thus, the shortening of a TAT can be achieved as compared with a mask ROM built-in microcomputer, and management and fabrication costs can be reduced.

9 Claims, 8 Drawing Sheets

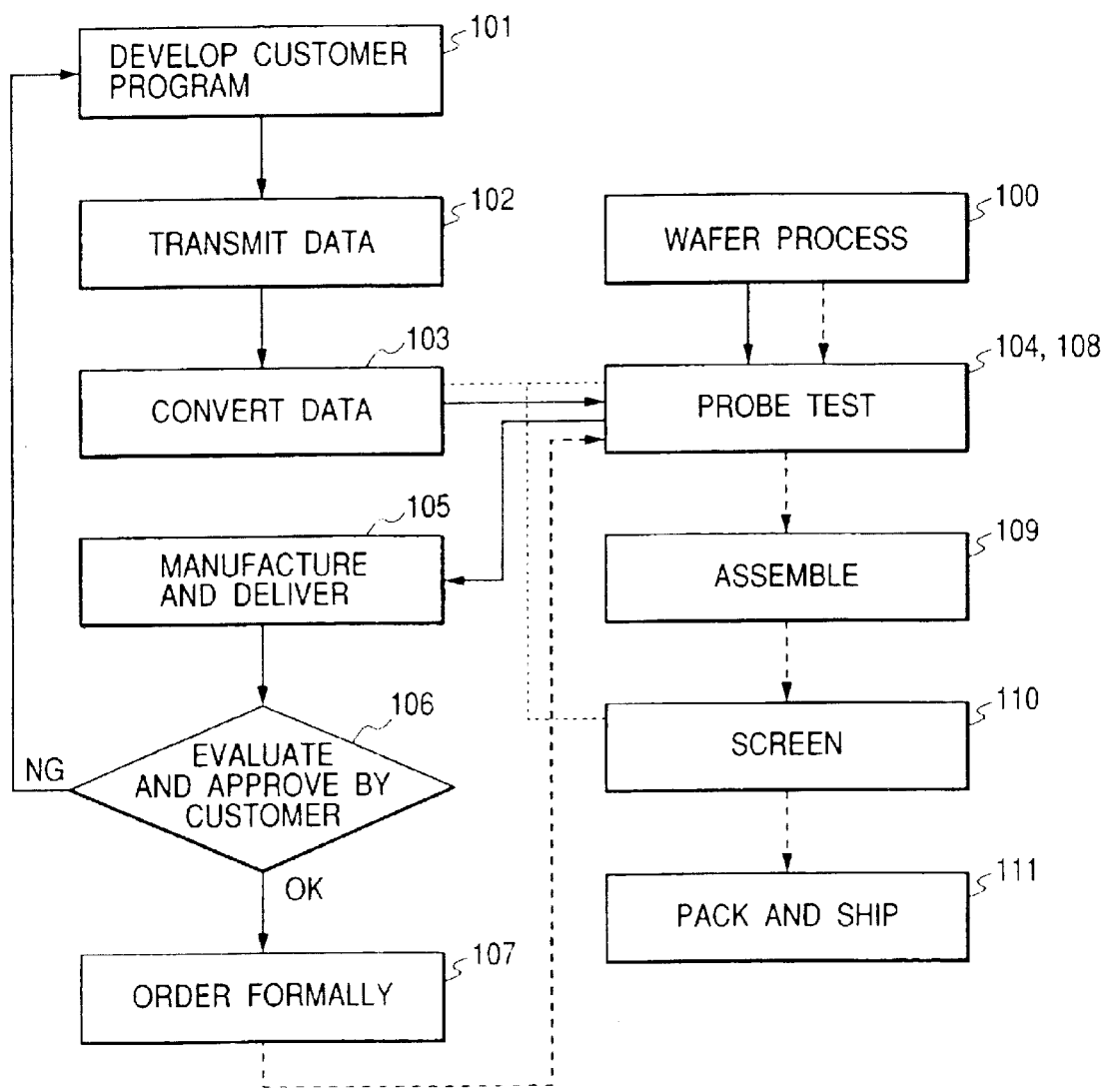

FLASH ROM BUILT-IN MICROCOMPUTER

MASK ROM BUILT-IN MICROCOMPUTER

FLASH MEMORY BUILT-IN MICROCOMPUTER

FABRICATION METHOD OF SEMICONDUCTOR DEVICE

CROSS-REFERENCE TO RELATED APPLICATION

This application is a division of application Ser. No. 10/457,549 filed Jun. 10, 2003, now U.S. Pat. No. 6,815,322.

BACKGROUND OF THE INVENTION

The present invention relates to a technology for manufacturing a semiconductor device, and particularly to a technology effective if applied to a method of manufacturing a semiconductor device having a nonvolatile memory, which is mounted on a system LSI (Large Scale Integrated Circuit) or the like.

As a general-purpose microcomputer equipped with a nonvolatile memory which continues to retain memory information even if power is turned off, may generally be mentioned an OTP (One Time Programmable) ROM (Read Only Memory) built-in microcomputer or a flash memory built-in microcomputer intended for a customer-based soft development or debugging, or a mask ROM built-in microcomputer intended for a cost reduction at mass production, or the like. Here, an OTPROM is a nonvolatile memory (inclusive of an EPROM (Erasable Programmable Read Only Memory)) capable of writing memory contents therein only once by a customer, a flash memory is a nonvolatile memory (inclusive of EEPROM (Electrically Erasable Programmable Read Only Memory)) capable of electrically effecting all of erasure/reprogramming of memory information, and a mask ROM is a program-fixed nonvolatile memory which writes memory information therein in a manufacturing process.

Incidentally, a technology for allowing a plurality of types of semiconductor elements to be formed on a sheet of semiconductor wafer and enhancing production efficiency of various kinds of semiconductors has been described in, for example, Unexamined Patent Publication Hei 7(1995)-283287 of Iwasaki et al.

Further, a simple manufacturing method of a semiconductor device, which is capable of effecting writing on a read only memory element of the semiconductor device having a flash memory element and a read only element together during a semiconductor device manufacturing process and carrying out reading even without writing after its commercialization, has been disclosed in, for example, Unexamined Patent Publication Hei 5(1993)-304277 of Yamamoto et al.

SUMMARY OF THE INVENTION

The present inventors have discussed a method of manufacturing a microcomputer having built therein a mask ROM as a nonvolatile memory. The following is a technology discussed by the present inventors, and its summary is as follows:

FIG. 8 is a process diagram showing one example of a fabrication process of the mask ROM built-in microcomputer discussed by the present inventors.

A program for the mask ROM is first developed by a customer (Step 100). This customer program is data-transmitted to a manufacturing site (Step 101). Next, the transmitted data is converted (Step 102). Further, a mask is fabricated based on the data (Step 103), and wiring patterns are formed on a base wafer (Step 104) fabricated in a wafer process (1) in advance, using the mask in a wafer process (2) (Step 105), whereby a prototype of a mask ROM built-in microcomputer is manufactured. Incidentally, test items, standards, etc. employed in a subsequent probe test and screening are also simultaneously created upon the data conversion in Step 102.

Next, whether mask ROM built-in microcomputers formed in individual chips on the wafer are non-defective or defective, is determined by a probe test (Step 106), and thereafter, a prototype is delivered to a customer (Step 107). The prototype is evaluated by the customer. When it is determined that no problem occurs in the corresponding mask ROM and the microcomputer with the mask ROM built therein (Step 108), an order for the fabrication of the mask ROM built-in microcomputer is formally forwarded to the manufacturing site (Step 109). Thereafter, wiring patterns are formed on the base wafer by use of the mask in the wafer process (2) (Step 110). Whether the mask ROM built-in microcomputers formed in the individual chips on the wafer are non-defective or defective, is determined by a probe test (Step 111). Afterwards, the non-defective mask ROM built-in microcomputers are assembled (Step 112) and their screening according to product standards is performed (Step 113), and each of the mask ROM built-in microcomputers each having satisfied the product standards is packed and shipped (Step 114).

Incidentally, when a problem on the program occurs in the corresponding mask ROM or the microcomputer with the mask ROM built therein upon the customer evaluation in Step 108, the program is discussed again by the customer and a mask ROM built-in microcomputer is prototyped and evaluated in a manner similar to the above process steps subsequently.

However, the following problems have become evident after the present inventors have discussed the method of manufacturing the mask ROM built-in microcomputer.

In the case of a mask ROM, a dedicated mask is fabricated based on a customer program and each wiring pattern is formed using the mask, whereby the customer program is written into its corresponding base chip. Therefore, the mask ROM has a problem in that a mask charge becomes a burden regardless of the produced number thereof, and a TAT (Turn-and Around Time) of a manufacturing process becomes long.

Since it is difficult to produce mask ROM built-in microcomputers in just proportion according to the-number thereof by order, they are normally produced in excess of the required number thereof and thereafter the number of their shipments is adjusted according to customer's requests. With a progress of an increase in the diameter of the wafer, however, the number of ordered mask ROM built-in microcomputers per company is supposed to become fewer than the number of mask ROM built-in microcomputers obtained from one wafer. In this case, there is fear that the original cost of each microcomputer product rises due to the unwanted mask ROM built-in microcomputers.

On the other hand, a microcomputer with a flash memory built therein as a nonvolatile memory grows in demand as well. However, a test process therefor increases in complexity as compared with the mask ROM built-in microcomputer, thus resulting in the occurrence of a problem that the TAT becomes long and its manufacturing cost rises. Therefore, a changeover from all of mask ROMs each having a microcomputer built therein to flash memories is considered to be difficult.

An object of the present invention is to provide a technology capable of achieving the shortening of a TAT of a microcomputer with a built-in nonvolatile memory.

Another object of the present invention is to provide a technology capable of reducing the cost of a microcomputer with a built-in nonvolatile memory.

The above, other objects and novel features of the present invention will become apparent from the description of the present specification and the accompanying drawings.

Summaries of representative ones of the inventions disclosed in the present application will be explained in brief as follows:

The present invention comprises the steps of: forming, in each chip lying within a wafer, a semiconductor device having a nonvolatile memory comprised of memory cells each substantially identical in structure to each of memory cells of a flash memory; bringing a probe into contact with each of electrode pads of the semiconductor device to thereby write memory information into the corresponding nonvolatile memory; and disabling rewriting of the memory information written into the nonvolatile memory, whereby the memory information written into the nonvolatile memories are made different for each wafer or every plural wafers, or for each chip in the wafer or every plural chips in the wafer to thereby form a plurality of types of nonvolatile memories different in specification from one another.

Further, the present invention comprises the steps of: forming, in each chip lying within a wafer, a semiconductor device having a nonvolatile memory comprised of memory cells each substantially identical in structure to each of memory cells of a flash memory; converting a program developed by a customer into data; writing memory information into the corresponding nonvolatile memory in a probe test process and thereafter probe-testing the semiconductor device having the nonvolatile memory; passivating an erase circuit and a write circuit to thereby disable rewriting of the memory information; assembling the semiconductor devices each having the nonvolatile memory; and screening the semiconductor devices each having the nonvolatile memory, whereby the memory information is directly transferred to a probe test device, based on instructions given by a production management system after the conversion of the program developed by the customer into the data.

BRIEF DESCRIPTION OF THE DRAWINGS

FIG. 1 is a process diagram showing one example of a fabrication flow of a microcomputer with a built-in flash ROM, which is illustrative of one embodiment of the present invention;

DETAILED DESCRIPTION OF THE PREFERRED EMBODIMENTS

Figure 2A:
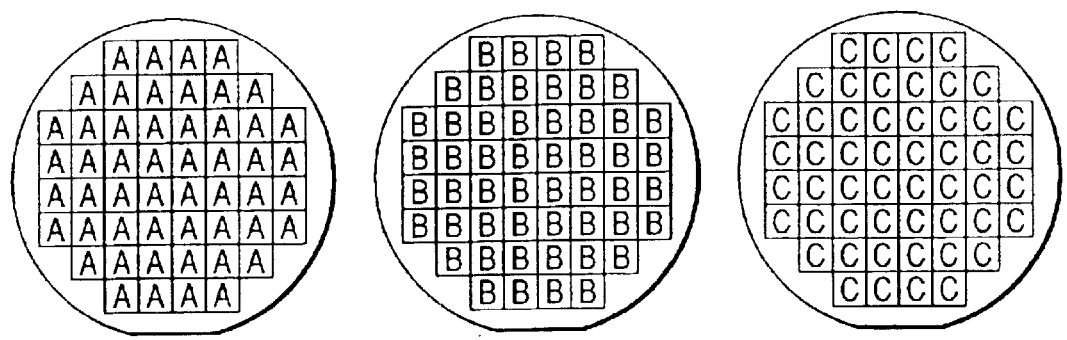
FIGS. 2(a) through 2(c) respectively illustrate examples of layouts of chips in a wafer, each formed with the flash ROM built-in microcomputer illustrative of the one embodiment of the present invention.

Preferred embodiments of the present invention will hereinafter be described in detail with reference to the accompanying drawings. Incidentally, members each having the same function in all the drawings for describing the embodiments are respectively identified by the same reference numerals and their repetitive description will therefore be omitted.

Incidentally, the term of a semiconductor device in the present application is defined inclusive of ones simply formed not only on a monocrystal silicon substrate but also on other substrates such as an SOI (Silicon on Insulator) substrate, a TFT (Thin Film Transistor) liquid crystal substrate except for a case specified as being not so in particular.

When reference is made to the number of elements or the like (inclusive of the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including factor steps, etc.) employed in the following embodiments are not always essential unless otherwise specified in particular and considered to be definitely essential in principle.

Similarly, when reference is made to the shapes, positional relations and the like of the components or the like in the following embodiments, they include ones substantially analogous or similar to their shapes or the like unless otherwise specified in particular and considered to be definitely so in principle. This is similarly applied even to the above numerical values and range.

FIG. 1 is a process diagram showing one example of a fabrication flow of a microcomputer with a built-in flash ROM, which is illustrative of one embodiment of the present invention. The flash ROM described herein is a nonvolatile memory constituted by memory cells each substantially identical in structure to each of memory cells of a flash memory, which is formed using a manufacturing process substantially identical to that for each memory cell of the flash memory. The flash ROM corresponds to a program-fixed nonvolatile memory which enables writing/erasing of memory information at the stage of its development but disables rewriting or reprogramming of memory information written before its shipment after its shipment.

Thus, the memory cell of the flash ROM has a one-transistor laminated gate structure, in which one memory cell is basically constituted of one two-layer gate MISFET (Metal Oxide Semiconductor Field Effect Transistor). The two-layer gate MISFET is formed by providing a floating gate on a substrate with a tunnel insulating film interposed therebetween and stacking a control gate thereon with an interlayer film interposed therebetween. For instance, information is stored therein by injection of electrons into the floating gate.

A base wafer formed with flash ROMs inclusive of wiring patterns is manufactured and prepared in advance in a wafer process by use of the same fabrication process as the flash memory (Step 100). Next, a program for the flash ROM is developed by a customer (Step 101). This customer program is data-transmitted to a manufacturing site (Step 102) and thereafter the transmitted data is converted (Step 103). Upon the data conversion, test items, product standards, etc. used for a post-probe test and screening are also simultaneously created or produced.

Next, writing of memory information into the flash ROMs formed in individual base chips on the base wafer, and a probe test on the flash ROM built-in microcomputer are executed (Step 104). In this process step, the writing of the memory information into each flash ROM based on instructions given by a production management system is first executed using a probe card in which probes are disposed in alignment with full electrode pads of the flash ROM built-in microcomputer. Thereafter, a decision as to whether the flash ROM built-in microcomputer is either a non-defective unit or a defective unit, is made on the probe test. Incidentally, the converted data may be transferred directly to a probe test device, based on the instructions given by the production management system.

Next, a prototype is delivered to a customer (Step 105). When the customer evaluates the prototype and determines that no problem occurs in the corresponding flash ROM and the microcomputer with the flash ROM built therein (Step 106), an order for the fabrication of the flash ROM built-in microcomputer is formally forwarded to the manufacturing site (Step 107).

Next, writing of memory information into the flash ROM formed in each of the individual base chips on the base wafer, and a decision as to whether the flash ROM built-in microcomputer is non-defective or defective, is made by the probe test (Step 108). The memory information written herein cannot be rewritten or reprogrammed after shipment of the microcomputer. As will be described later, for example, an erase circuit and a write circuit are passivated to thereby disable the rewriting of the memory information. Although the threshold value (Vth) of the memory cell of the flash ROM is relatively set high to write the memory information therein, its wiring may excessively be done.

In the flash ROM built-in microcomputer, the flash ROM constituted by the memory cells each substantially identical in structure to each memory cell of the flash memory including the wiring patterns is formed on the base wafer in advance, and the customer program is written into the flash ROM by use of the probe card in the process of executing the probe test. Thus, a TAT of the flash ROM built-in microcomputer can be set shorter than a TAT (corresponding to a period from the reception of a program from a customer to the delivery of a product) of a mask ROM built-in microcomputer wherein wiring patterns are formed on a base wafer by use of a dedicated mask fabricated after the reception of the customer program.

Thereafter, non-defective flash ROM built-in microcomputers are assembled (Step 109). Further, their screening is done in view of the product standards (Step 110), and the flash ROM built-in microcomputers each having satisfied the product standards, are packed and shipped (Step 111). Upon the above screening, the test items that could not be measured on the probe test, are tested and appearance conditions and reliability tests or the like are further executed.

Incidentally, when a problem about the program occurs in the flash ROM or the microcomputer with the built-in flash ROM upon the customer's evaluation in Step 106, the program is re-discussed by the customer, and thereafter a flash ROM built-in microcomputer is re-prototyped and evaluated in a manner similar to the above process steps.

Figure 2B:
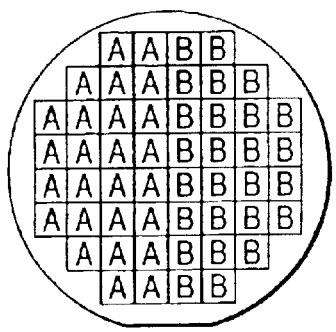
Figure 2C:
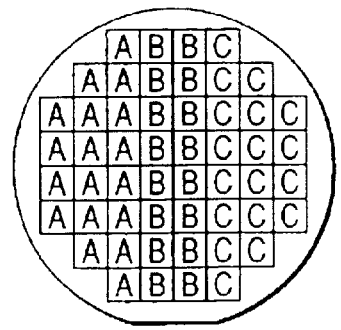

FIG. 2 shows examples of layouts of chips in a wafer, each of which is formed with the flash ROM built-in microcomputer illustrative of the one embodiment of the present invention.

Since predetermined signals can respectively be inputted to a plurality of probes provided in a used probe card upon a probe test for writing memory information into each flash ROM, microcomputers with built-in flash ROMs (e.g., product specification A, product specification B and product specification C) different in product specification at each wafer can be formed (see FIG. 2(*a*)). Further, microcomputers having incorporated therein flash ROMs (e.g., product specification A, product specification B and product specification C) different in product specification every plural regions or every individual chips can be formed even on a sheet of wafer (see FIGS. 2(*b*) and 2(*c*)).

Thus, since the flash ROM built-in microcomputers different in product specification can be respectively provided in just proportion according to the number thereof by order, there is no need to fabricate base wafers equivalent to the same number as the number of product developments and adjust the number of shipped products according to customer's requests. Thus, since the number of managements for the base wafers and the number of in-process products are reduced and mask management becomes unnecessary, the cost of managing each flash ROM built-in microcomputer can be set lower than the cost of managing each mask ROM built-in microcomputer.

Figure 3:
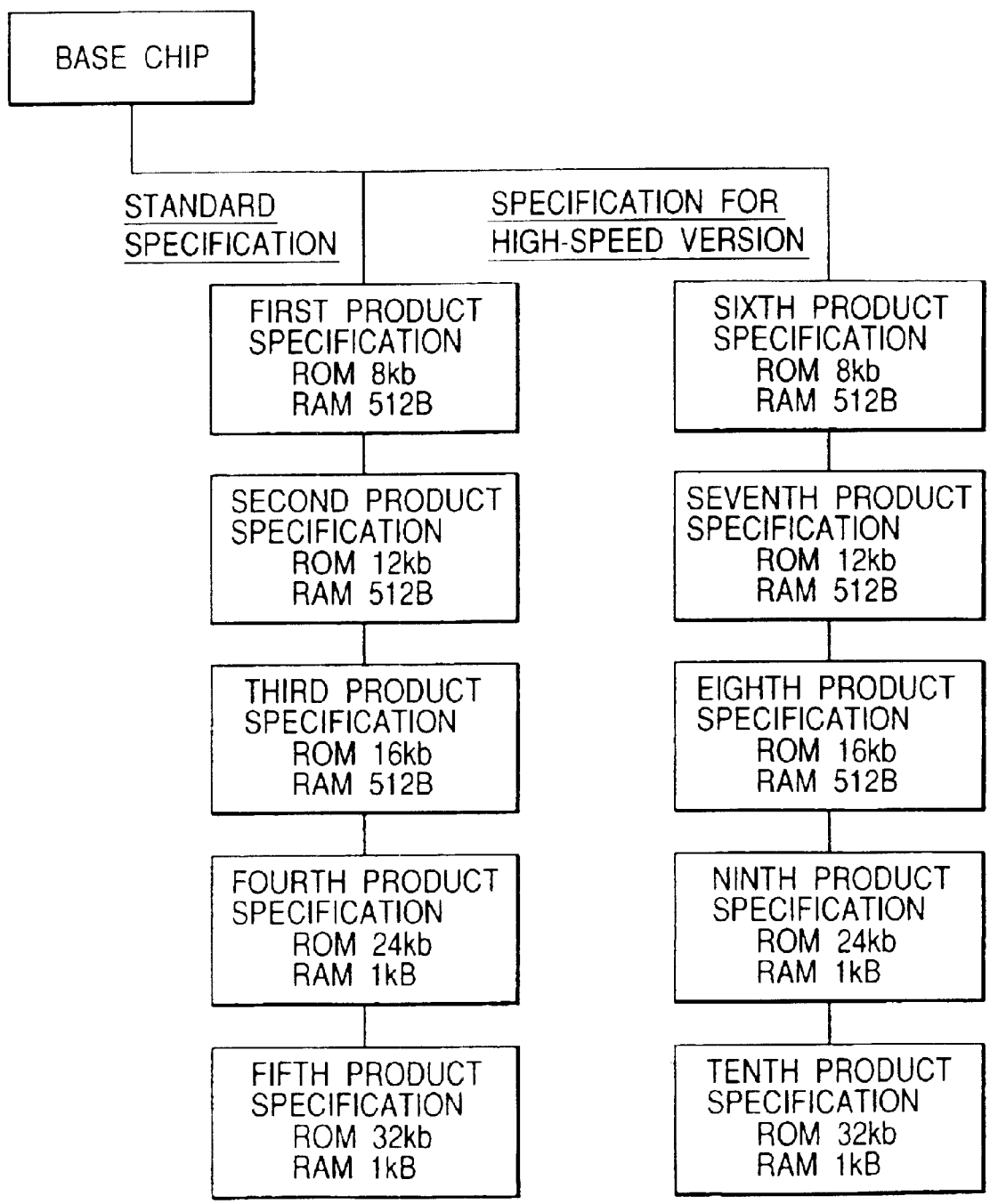
FIG. 3 shows one example of product developments of the flash ROM built-in microcomputers each illustrative of the one embodiment of the present invention.

FIG. 3 shows one example of product developments of the flash ROM built-in microcomputers each illustrating the one embodiment of the present invention.

The present embodiment shows, as an example, a case in which flash ROM built-in microcomputers are developed as products with the flash ROMs being changed in specification. The present embodiment illustrates first through tenth product specifications as product specifications. Memory information are written into their corresponding flash ROMs in the probe test process (see Steps 104 and 108) so that individual base chips on a base wafer prepared in advance meet their corresponding product specifications.

Figure 8:
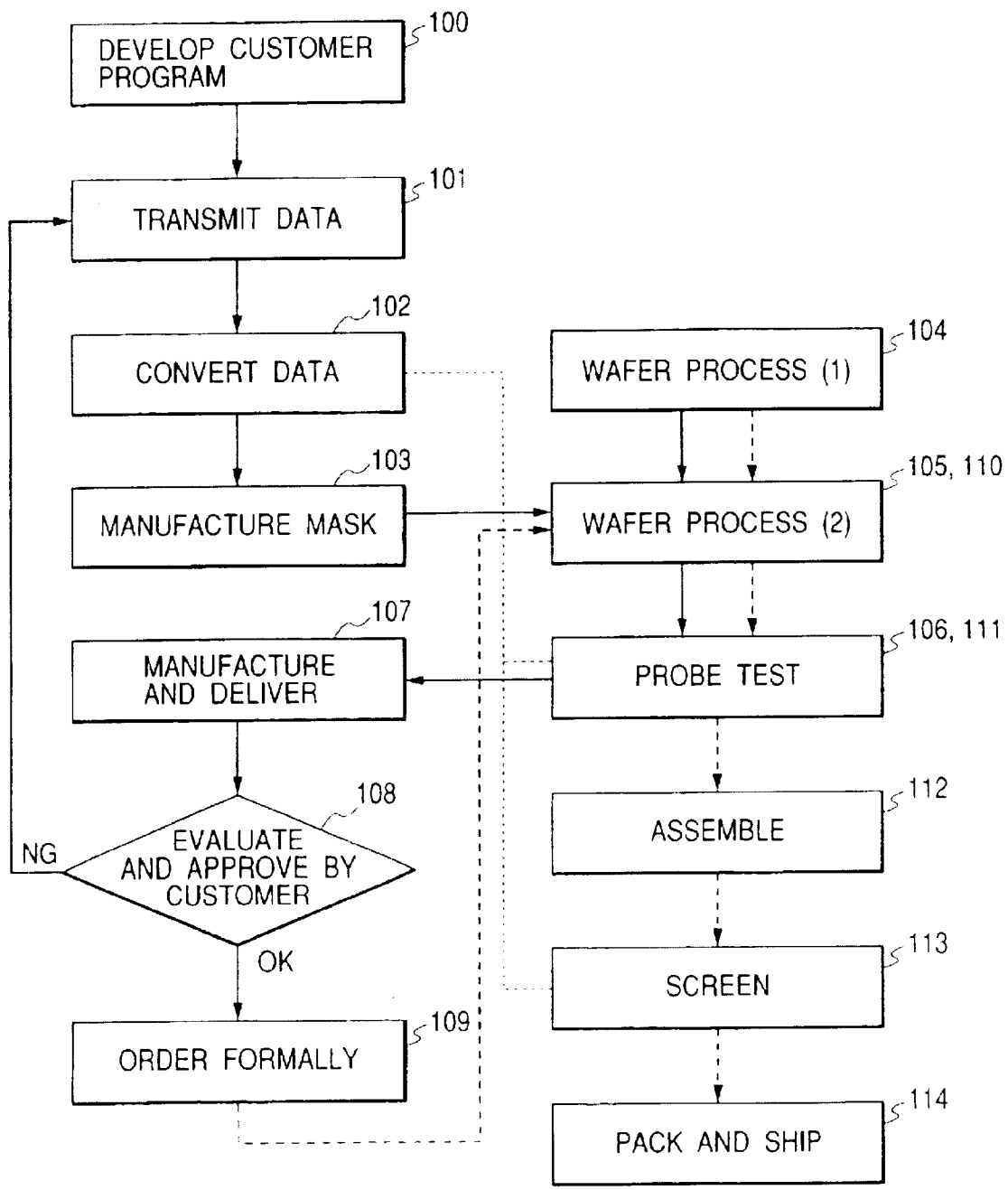
FIG. 8 is a process diagram showing one example of a fabrication flow of a microcomputer with a built-in mask ROM, which has been discussed by the present inventors.

On the other hand, respective dedicated masks used in a wafer process (2) (see Steps 105 and 110 in FIG. 8) are first fabricated according to the first through tenth product specifications in the mask ROM built-in microcomputers. The corresponding mask ROM built-in microcomputers based on the first through tenth product specifications are formed using the masks. Further, since other ROM products, e.g., OTPROMs or flash memories or the like are required upon testing of the mask ROM built-in microcomputers, there is a need to develop other ROM products.

Thus, since there is no need to fabricate the dedicated masks when the ROM products are developed as products, the flash ROM built-in microcomputers can be reduced in manufacturing cost as compared with the mask ROM built-in microcomputers using the dedicated masks. Further, since other ROM products for testing become unnecessary in the case of the flash ROMs, only the flash ROMs may be developed as the ROM products in the case of the flash ROM built-in microcomputers. The number of man-hours for circuit design is reduced and the period required to develop the flash ROMs can be shortened as compared with the mask ROM built-in microcomputers.

Table 1 shows a summary of comparisons of principal items of the flash ROM built-in microcomputer showing the one embodiment of the present invention and the mask ROM built-in microcomputer discussed by the present inventors.

| | ROM | |
|---|---|---|
| Items | Flash ROM built-in microcomputer | Mask ROM built-in microcomputer |
| TAT | 0.5 to 1 weeks | 4 to 6 weeks |
| management cost | relatively low | relatively high |
| number of product developments | unnecessary | same as number of receptions of customer ROMs |
| mask charge | unnecessary | about ¥1,500,000 (6" wafer) |
| number of types of base developed products | 1 | 2 to 3 |

A TAT, from the reception of a program from a customer to the delivery of each product via a development period takes about 4 to 6 weeks in the case of the mask ROM built-in microcomputer. In the flash ROM built-in microcomputer to the contrary, a mask manufacturing step (Step 103 in FIG. 8) and a wafer process (2) (Steps 105 and 110 in FIG. 8) necessary for the mask ROM built-in microcomputer are deleted and hence the number of manufacturing process steps can be reduced. Therefore, a development period and a manufacturing time can be shortened and the above TAT can be shortened to about ⅕ or less of the TAT of the mask ROM built-in microcomputer like about 0.5 to 1 weeks.

Since the flash ROM built-in microcomputers corresponding to the number thereby by order, which are different in product specifications, can be fabricated, there is no need to fabricate many base wafers corresponding to the dedicated masks as in the mask ROM built-in microcomputers, and the management cost for each flash ROM built-in microcomputer can be reduced.

Although the dedicated masks of the same number as the number of product developments of ROMs required by the customer in the case of the mask ROMs are needed upon development of the ROM products, no masks are needed in the case of the flash ROMs. As a result, such a mask charge that the mask ROM built-in microcomputer needs about ¥1,500,000 in the case of, for example, a 6" wafer, becomes unnecessary for the flash ROM built-in microcomputer, and hence the manufacturing cost can be reduced. Further, since other ROM products are used for testing of the mask ROMs, ROM products of two to three types (OTPROM, flash memory or OTPROM and flash memory in addition to mask ROM) are necessary for the mask ROM built-in microcomputer. However, since only one kind of flash ROM may be used in the flash ROM built-in microcomputer, a development period can be shortened.

FIG. 4 is a process diagram showing respective fabrication flows of a flash ROM built-in microcomputer, a mask ROM built-in microcomputer, and a flash memory built-in microcomputer.

Figure 4A:
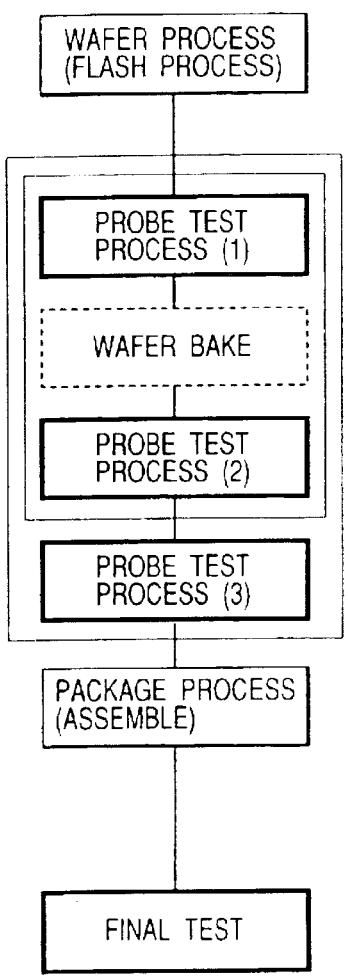
FIGS. 4(a) through 4(c) are respectively process diagrams showing fabrication flows of a flash ROM built-in microcomputer, a mask ROM built-in microcomputer, and a flash memory built-in microcomputer.

In the case of the flash ROM built-in microcomputer showing the present embodiment shown in FIG. 4(a), a memory cell substantially identical in structure to a flash memory provided with wiring patterns is formed using the same manufacturing process as the flash memory in a wafer process. Afterwards, memory information is written into the memory cell in a first probe test process and a flash ROM is thereafter tested in first and second probe test processes, followed by execution of tests on the functions/performance and the like of a RAM and logic in a third probe test process. Each flash ROM built-in microcomputer judged to be non-detective on the probe test is assembled and its screening according to product standards is performed in a final test.

Figure 4B:
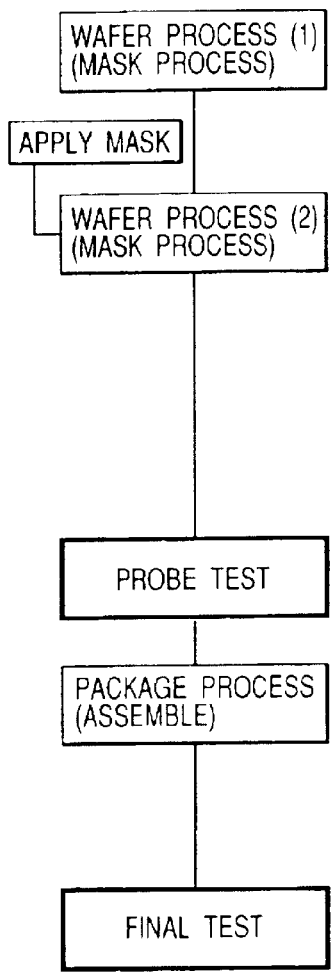

In the case of the mask ROM built-in microcomputer shown in FIG. 4(b), a memory cell unprovided with wiring patterns is formed in a wafer process (1). In a wafer process (2) subsequent to the above, wiring patterns are formed using dedicated masks, and memory information is written into the memory cell. Thereafter, tests on performance/functions and the like of a mask ROM, a RAM and logic are performed in a probe test process. Each mask ROM built-in microcomputer judged to be non-defective in the probe test process is assembled in a package process and its screening based on product standards is performed in a final test.

Figure 4C:
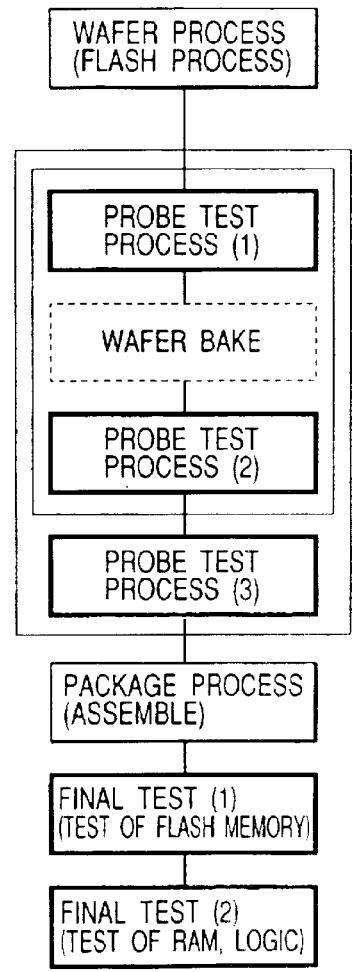

In the case of the flash memory built-in microcomputer shown in FIG. 4(c), a memory cell provided with wiring patterns is formed in a wafer process. Next, a test on a flash memory, using a dedicated memory tester is performed in first and second probe test processes, followed by execution of functions/performance and the like of a RAM and logic in a third probe test process. The corresponding flash memory built-in microcomputer judged to be non-defective in each of the first, second and third probe test processes is assembled in a package process, and its screening based on product standards is performed in a final process. In the final process, a test on the flash memory, using a dedicated memory tester is first performed in a first final process, and tests on the RAM and logic are carried out in a second final process.

Figure 5:
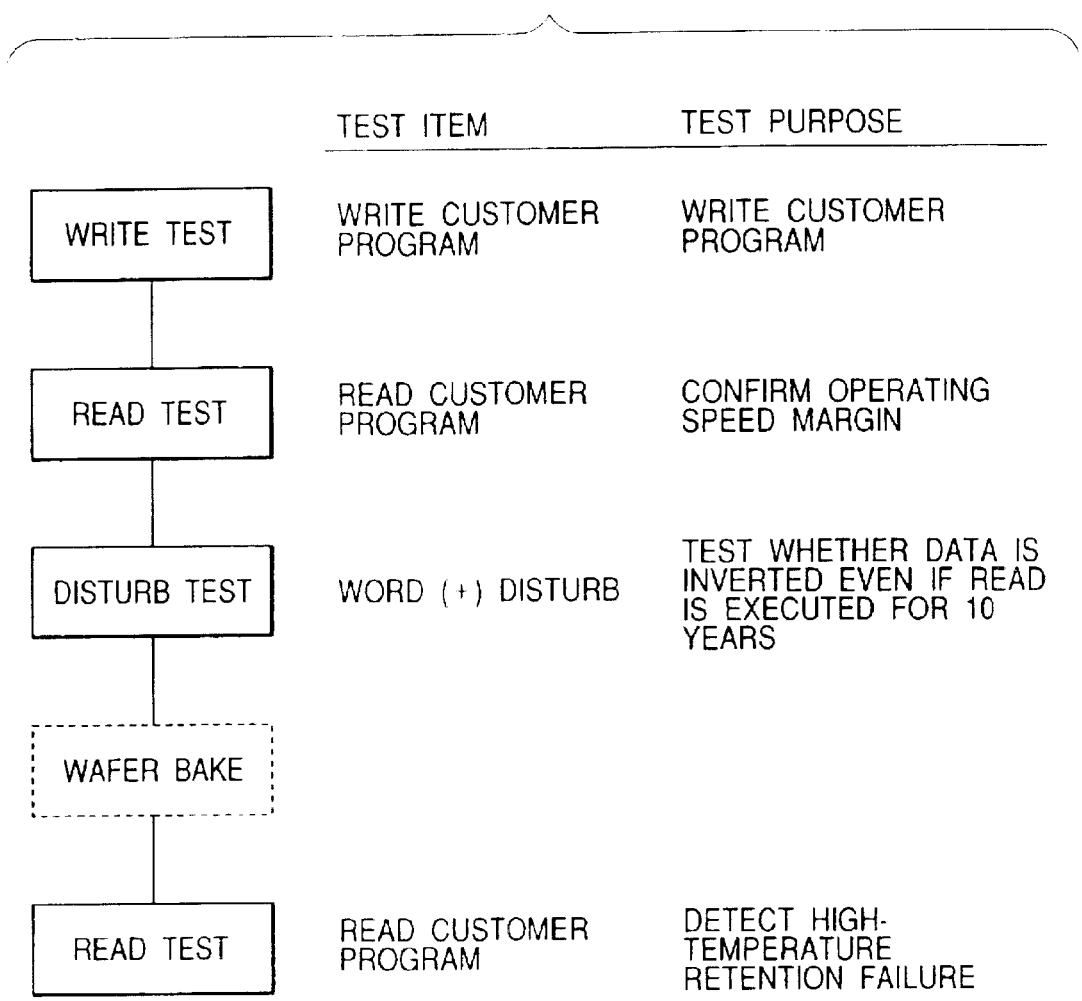
FIG. 5 shows one example illustrative of the contents of tests executed in probe test processes of a flash ROM built-in microcomputer.
Figure 6:
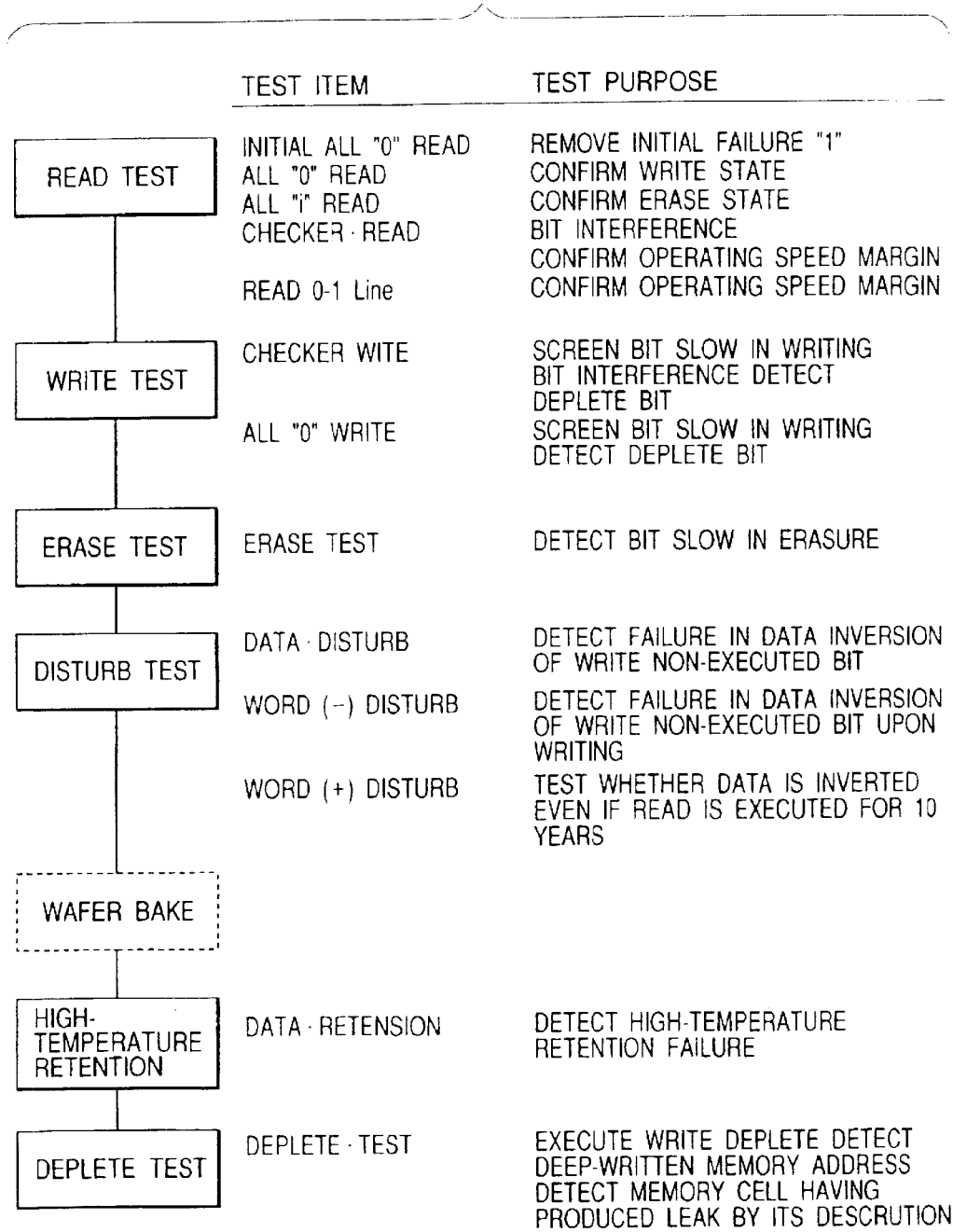
FIG. 6 illustrates one example illustrative of the contents of tests executed in probe test processes of a flash memory built-in microcomputer.

One example descriptive of the contents of tests on a flash ROM in probe test processes (1) and (2) of a flash ROM built-in microcomputer is shown in FIG. 5, and one example descriptive of the contents of tests on a flash memory in probe test processes (1) and (2) of a flash memory built-in microcomputer is shown in FIG. 6.

As the contents of the tests on the flash ROM, may be mentioned, for example, a write test, a read test, a disturb test, and a read test subsequent to wafer bake, etc. On the other hand, the contents of the tests on the flash memory may include, for example, a read test, a write test, an erase test, a disturb test, high-temperature retention subsequent to wafer bake, deplete test, etc. Items for the respective tests also range widely.

Since the flash ROM built-in microcomputer needs not to execute such wide-ranging tests peculiar to the flash memory, which are performed in the flash memory built-in microcomputer, the number of test processes can be reduced to about 1/10 as compared with the flash memory built-in microcomputer, and no dedicated memory tester is required either. Accordingly, the TAT of the flash ROM built-in microcomputer can be set shorter than the TAT of the flash memory built-in microcomputer. Owing to a reduction in capital investment cost, the flash ROM built-in microcomputer can be reduced in product cost as compared with the flash memory built-in microcomputer.

Incidentally, the test of detecting such a retention failure that memory information written therein disappears, is performed upon the read test on the flash ROM in the flash ROM built-in microcomputer. Since, however, the flash ROM is capable of excessively performing writing, for example, as compared with the flash memory, the flash ROM built-in microcomputer does not necessarily require the retention test.

Figure 7:
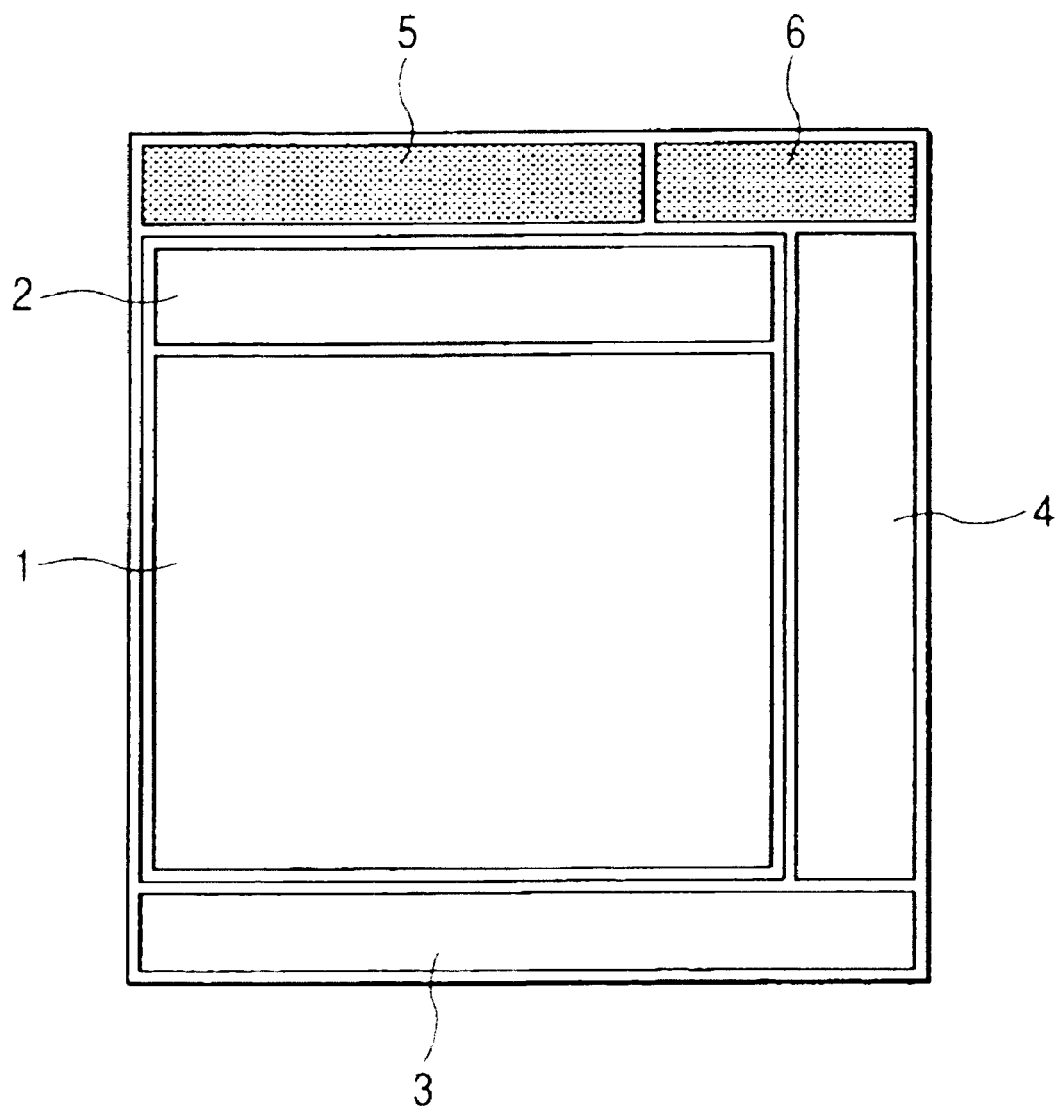
FIG. 7 is a circuit layout example in a functional block of a flash ROM constituting the flash ROM built-in microcomputer illustrative of the one embodiment of the present invention.

FIG. 7 is a circuit layout example in a functional block of a flash ROM constituting the flash ROM built-in microcomputer illustrative of the one embodiment of the present invention. In the drawing, reference numeral 1 indicates a flash ROM user utilizing area, reference numeral 2 indicates a flash RPOM unopen area, reference numeral 3 indicates a first read circuit, reference numeral 4 indicates a second read circuit, reference numeral 5 indicates a write circuit, and reference numeral 6 indicates an erase circuit, respectively.

A customer program is written into the flash ROM user utilizing area 1. Upon shipment of the flash ROM built-in microcomputer, the write circuit 5 and the erase circuit 6 are passivated and memory information of the flash ROM cannot be rewritten or reprogrammed after the shipment thereof.

There is a need to set a threshold value of each of memory cells of a flash memory to within a predetermined range. When the threshold value falls out of this range, the flash memory is judged to be defective. In the flash ROM, however, a relatively high threshold value and a relatively low threshold value are determined and memory information written into the corresponding memory cell is read. Thus, since the memory cell of the flash ROM can take its threshold standard range widely as compared with the flash memory, the production yield of the flash ROM built-in microcomputer becomes higher than that of the flash memory built-in microcomputer.

Thus, according to the present embodiment, the mask fabrication process and the wafer process (2) for forming the wiring patterns, which are required for the writing of the memory information in the mask ROM built-in microcomputer, become unnecessary for the flash ROM built-in microcomputer, the TAT of the flash ROM built-in microcomputer can be set shorter than the TAT of the mask ROM built-in microcomputer.

Since the flash ROM built-in microcomputers different in product specification can be respectively provided in just proportion according to the number thereof by order as well, the flash ROM built-in microcomputers can be reduced in management cost as compared with the mask ROM built-in microcomputers.

Further, when each ROM product is developed, the flash ROM built-in microcomputer needs not to fabricate the dedicated mask and can be reduced in manufacturing cost as compared with the mask ROM built-in microcomputer. Since the flash ROM built-in microcomputer does not require other ROM products for testing, the number of man-hours for circuit design is reduced and hence its development period can be shortened, as compared with the mask ROM built-in microcomputer which needs other ROM products for testing.

Still further, since the flash ROM built-in microcomputer does not require wide-ranging tests peculiar to the flash memory, which have been performed in the flash memory built-in microcomputer, the TAT of the flash ROM built-in microcomputer can be shortened as compared with that of the flash memory built-in microcomputer.

Still further, since each memory cell of the flash ROM can take a threshold standard range widely as compared with the flash memory, the production yield of the flash ROM built-in microcomputer can be set higher than that of the flash memory built-in microcomputer.

While the invention developed above by the present inventors has been described specifically based on the illustrated embodiments, the present invention is not limited to the embodiments. It is needless to say that various changes can be made thereto within the scope not departing from the substance thereof.

While the above embodiment has described, for example, the case in which the invention is applied to the ROM product built in the microcomputer, the present invention is not limited to it. The invention can be applied even to a ROM product fabricated as single, for example.

While the memory cell of the flash ROM is set to substantially the same structure as the memory cell of the flash memory in the illustrated embodiment, the memory cell thereof can be set to substantially the same structure as, for example, a memory cell of a ferroelectric RAM (Random Access Memory) in which a ferroelectric film is caused to have a write function, or a memory cell of an MRAM (Magnetoresistive Random Access Memory) using the direction of magnetization of a ferroelectric body in an information memory carrier.

Advantageous effects obtained by a representative one of the inventions disclosed in the present application will be described in brief as follows:

As a nonvolatile memory built in a microcomputer, a flash ROM is adopted which includes memory cells each substantially identical in structure to each of memory cells of a flash memory and which writes memory information therein in a probe test process and disables rewriting of the memory information after its shipment. Thus, the shortening of TAT can be achieved as compared with a mask ROM built-in microcomputer, and management and fabrication costs can be reduced. Further, the shortening of TAT can be achieved as compared with a flash memory built-in microcomputer, and production yields can be enhanced.

What is claimed is:

1. A method of fabricating a semiconductor device, comprising the steps of:
    (a) forming a logic circuit and an electrically reprogrammable ROM circuit each having substantially the same structure in each of first and second chip areas on a wafer;
    (b) discretely or simultaneously executing a first electrical operation test on the first and second chip areas
    (c) after said step (b), respectively electrically writing first and second ROM pattern data corresponding to first and second user's uses into the ROM circuits in the first and second chip areas respectively, as a step prior to or below the first electrical operation test;
    (d) dividing the wafer into the first and second chip areas after said step (c); and
    (e) executing a second electrical operation test on the divided first and second chip areas respectively.

2. The method according to claim 1, wherein prior to said step (d), the first and second ROM pattern data are made unerasable or unreprogrammable according to an electrical signal operation normally open to a user.

3. The method according to claim 1, wherein the first and second ROM pattern data are identical to each other.

4. The method according to claim 1, wherein the first and second ROM pattern data are different from each other.

5. The method according to claim 1, wherein the electrically reprogrammable ROM circuit has a structure corresponding to a flash memory circuit.

6. The method according to claim 1, wherein the electrically reprogrammable ROM circuit has a structure corresponding to a ferroelectric RAM circuit.

7. The method according to claim 1, wherein the electrically reprogrammable ROM circuit has a structure corresponding to an MRAM circuit.

8. The method according to claim 1, wherein a retention test is unexecuted on the electrically reprogrammable ROM circuit before at least said step (d).

9. The method according to claim 1, further including a step of:
    (f) executing a retention test on the electrically reprogrammable ROM circuit as a step prior to said step (d) and after said step (c) or therebelow.

* * * * *